United States Patent [19]

Fischman et al.

[11] 3,962,649
[45] June 8, 1976

[54] SURFACE WAVE FREQUENCY DISCRIMINATOR

[75] Inventors: Martin Fischman; Edward I. Zmuda, both of Seneca Falls, N.Y.

[73] Assignee: GTE Sylvania Incorporated, Stamford, Conn.

[22] Filed: Jan. 6, 1975

[21] Appl. No.: 538,557

Related U.S. Application Data

[63] Continuation of Ser. No. 417,036, Nov. 19, 1973, abandoned.

[52] U.S. Cl. ............................ 329/103; 307/233 R; 325/349; 329/118; 329/134; 329/140; 358/23
[51] Int. Cl.² ........................................... H03D 3/16
[58] Field of Search ........... 329/103, 140, 117, 118, 329/134, 131–133; 325/349; 358/23; 307/233 R; 333/30, 72

[56] References Cited
UNITED STATES PATENTS

| | | | |
|---|---|---|---|
| 3,191,121 | 6/1965 | Nelson | 307/233 X |
| 3,209,212 | 9/1965 | Billings | 329/103 X |
| 3,209,253 | 9/1965 | Gray | 307/233 X |
| 3,714,594 | 1/1973 | Adler et al. | 329/117 |
| 3,750,027 | 7/1973 | Hartmann | 329/118 X |

*Primary Examiner*—Siegfried H. Grimm
*Attorney, Agent, or Firm*—Norman J. O'Malley; Robert E. Walrath

[57] ABSTRACT

A frequency discriminator utilizing a surface wave device is described wherein threshold means are used to suppress spurious responses due to the side lobes and other parasitic effects of the surface wave device.

13 Claims, 9 Drawing Figures

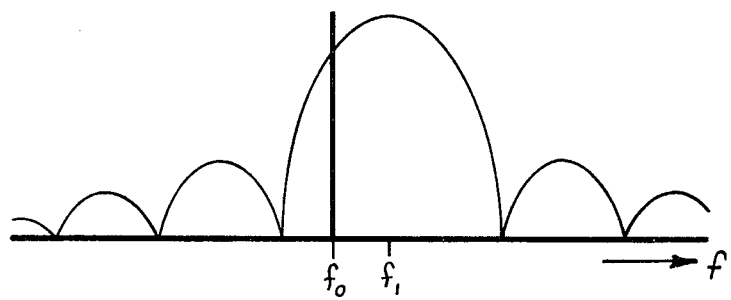
_Fig. 3A_
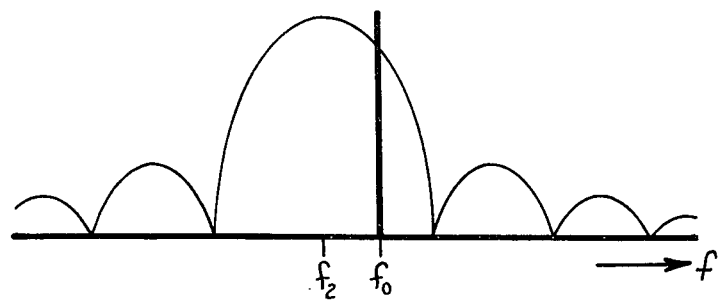
_Fig. 3B_
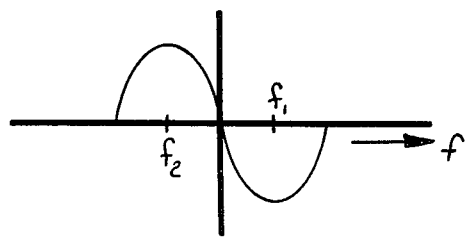
_Fig. 3C_
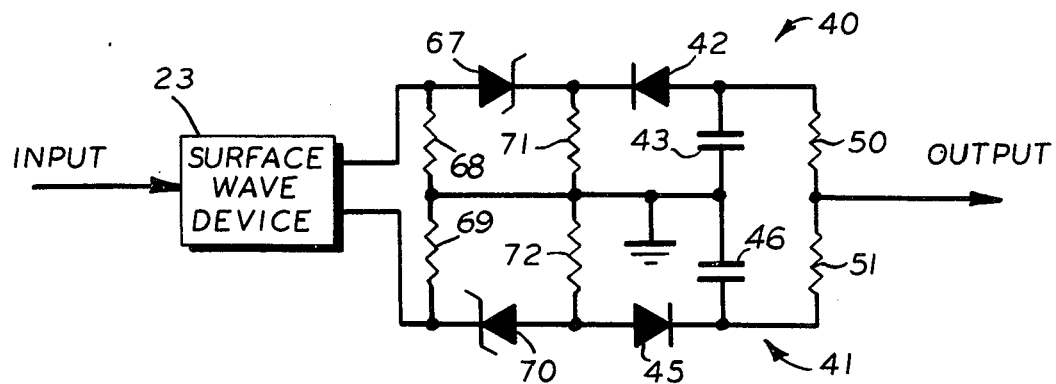
_Fig. 5_

SURFACE WAVE FREQUENCY DISCRIMINATOR

This is a continuation of application Ser. No. 417,036, filed Nov. 19, 1973 and now abandoned.

BACKGROUND OF THE INVENTION

This invention relates to surface wave devices and more particularly to surface wave devices used in frequency discriminators. The general characteristics of surface wave devices are well known. A surface wave is launched by an input transducer disposed on a piezoelectric substrate. The surface wave energizes one or more output transducers also disposed on the piezoelectric substrate. The frequency response of the surface wave device is normally characterized by the formula $f(X)=(\sin X/X)^2$ where $X = N\pi (f-f_0)/f_0$ in which $N$ is a number of pairs of fingers in the interdigital transducer and $f_0$ is the synchronous frequency or the frequency at which the maximum response occurs. In a frequency discriminator two output transducers conveniently positioned on opposite sides of the input transducer can be used. One output transducer has a peak frequency response at a frequency slightly higher than the design center frequency of the input transducer, while the other output transducer has a peak frequency response at a frequency slightly lower than the design center frequency of the input transducer. Assuming proper phasing, the composite frequency response is a typical s-shaped frequency discriminator characteristic.

The $(\sin X/X)^2$ response, however, gives rise to side lobes which in turn gives rise to spurious responses at various other frequencies. Furthermore, the idealized $(\sin X/X)^2$ response does not account for various parasitic effects such as bulk wave coupling in the piezoelectric substrate, inductive and capacitive feedthrough from the input to output transducers, and other similar parasitic effects. In various applications of a surface wave frequency discriminator such parasitic effects provide spurious responses which deleteriously effect the operation of the system. For example, in an automatic frequency control system the system may lock-in to a false or spurious output signal due to the spurious parasitic and side lobe response combinations.

OBJECTS AND SUMMARY OF THE INVENTION

Accordingly, it is an object of this invention to obviate the above-noted and other disadvantages of the prior art.

It is a further object of this invention to provide a surface wave frequency discriminator wherein spurious output signals due to side lobe and parasitic responses are suppressed.

It is a further object of this invention to provide a surface wave frequency discriminator with improved performance.

These and other objects and advantages of this invention are achieved in one aspect of this invention in a frequency discriminator including a piezoelectric substrate having an input transducer and first and second output transducers disposed thereon and detecting means connected to the output transducers. Limiting means connected to the detecting means maintains the detecting means in an inoperative condition in response to spurious signals from the output transducers having signal magnitudes less than a threshold level.

BRIEF DESCRIPTION OF THE DRAWINGS

FIGS. 3A, 3B, and 3C are frequency response curves to aid in explaining the operation of the invention; and FIGS. 4, 5, 6, and 7 are schematic diagrams of other embodiments of the invention.

DETAILED DESCRIPTION OF THE PREFERRED EMBODIMENTS

For a better understanding of the present invention, together with other and further objects, advantages, and capabilities thereof, reference is made to the following disclosure and appended claims in connection with the above-described drawings.

Figure 1:
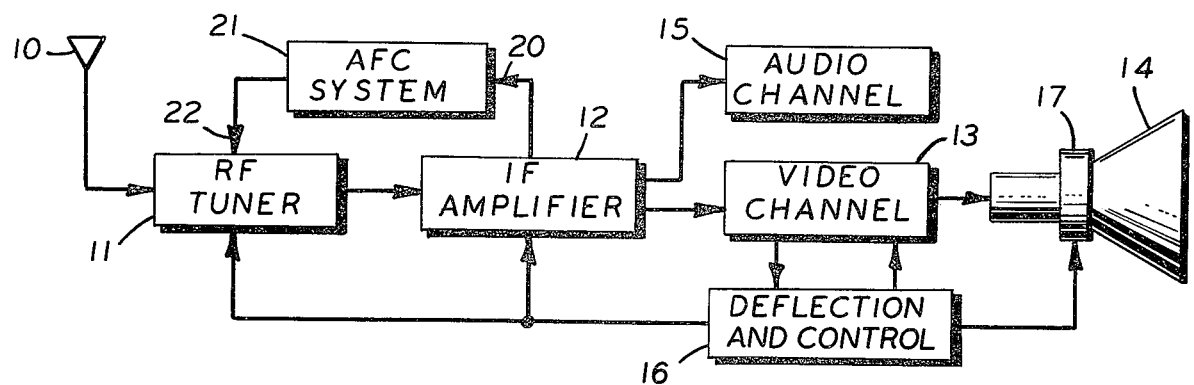
FIG. 1 is a block diagram of a television receiver in which the invention can be utilized.

In FIG. 1 a simplified block diagram of a typical television receiver is illustrated. An antenna 10 receives or intercepts television signals which are coupled to a radio frequency (RF) tuner 11. Tuner 11 provides an intermediate frequency (IF) signal to IF amplifier 12. Amplifier 12 provides a signal to video channel 13 which provides onne or more signals to an image display device illustrated as a cathode ray tube (CRT) 14. Amplifier 12 also provides the audio portion of the IF signal to audio channel 15. The synchronizing portion of the composite video signal is coupled from video channel 13 to deflection and control circuitry 16 which provides suitable deflection signals to a deflection yoke 17 positioned about the neck of CRT 14. Circuitry 16 also provides suitable gating and blanking signals to video channel 13 and automatic gain control (AGC) signals to tuner 11 and amplifier 12. Another output from IF amplifier 12, for example, from the last stage thereof, is coupled to an input 20 of an automatic frequency control (AFC) system 21 which has an output 22 coupled to RF tuner 11.

In typical AFC systems a frequency discriminator develops an error signal in response to frequency deviations of the IF signal from a predetermined frequency. The error signal is coupled to an oscillator in the tuner to control the oscillator frequency, and hence, the intermediate frequency such that the error signal tends towards zero. The invention disclosed herein can be used in AFC system 21 to develop the error signal. Those skilled in the art, however, will realize that the invention is not limited to AFC systems used in television receivers, but can also be used in other AFC systems as well as in frequency discriminators used in systems other than AFC systems.

Figure 2:
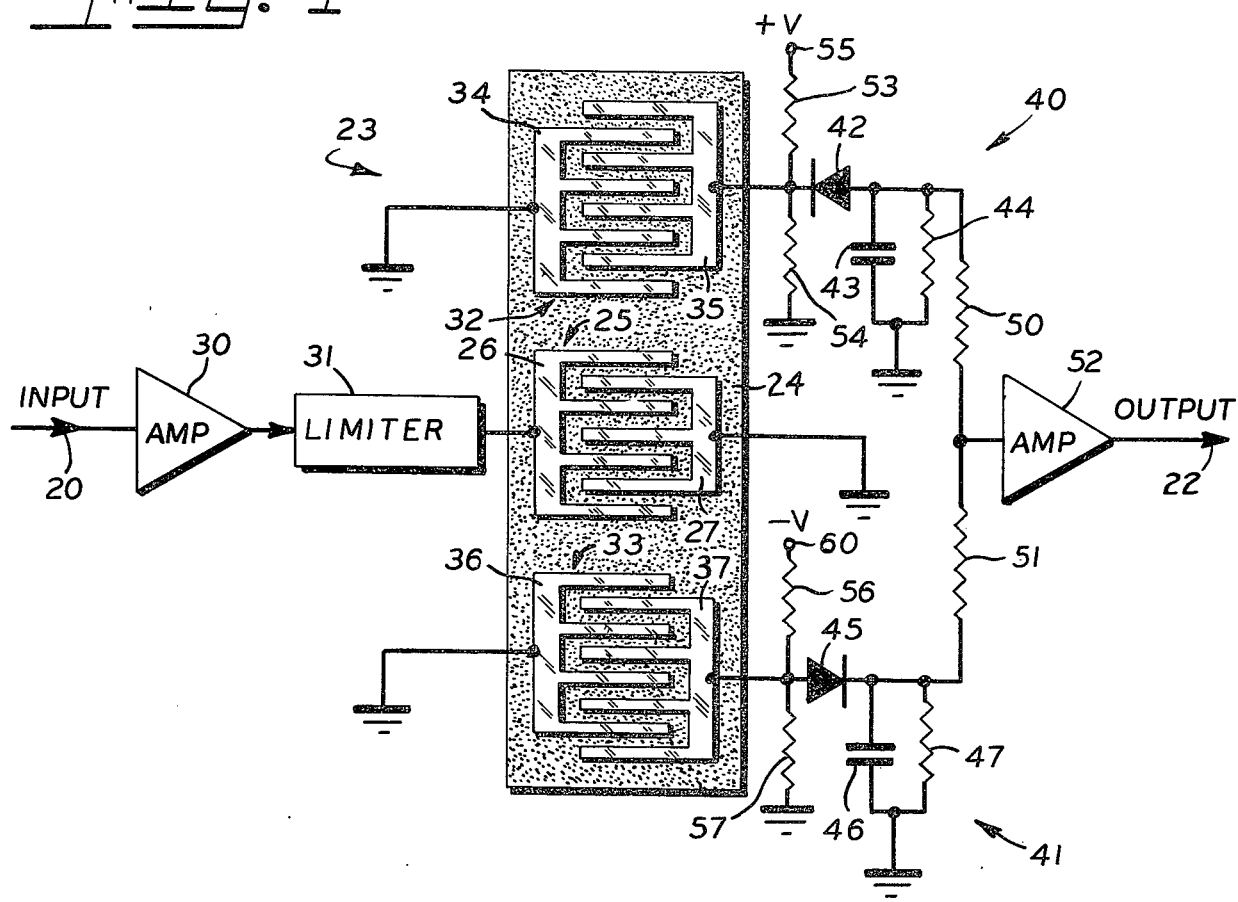
FIG. 2 is a schematic diagram of one embodiment of the invention.

In FIG. 2 an AFC system incorporating the invention is illustrated. A surface wave device 23 includes a piezoelectric substrate 24 of a suitable piezoelectric material such as PZT, quartz, lithium niobate, lithium tantalate, ZnO, ZnS, CdS, or other suitable material for propagating acoustic surface waves in the frequency range of interest. An input transducer 25 illustrated as an interdigital transducer (IDT) having interleaved metallic combs of electrodes 26 and 27 is disposed on the surface of substrate 24.

In general, AFC system 21 includes an amplifier 30 connected to input 20. A limiter 31 can be connected between amplifier 30 and input transducer 25. Preferably, the output of limiter 31 is connected to comb 26 while comb 27 is connected to circuit ground, however, a differential input across combs 26 and 27 can also be provided. The numbers of fingers, width of fingers, and spacing between adjacent fingers of combs 26 and 27 are selected to provide a frequency response maximum at the desired center frequency which in the AFC system of FIG. 1 is the IF video carrier frequency of 45.75 mHz.

First and second output transducers 32 and 33, illustrated as IDT's, are disposed on substrate 24 on opposite sides of input transducer 25. Transducer 32 has interleaved metallic combs of electrodes 34 and 35, while transducer 33 has interleaved metallic combs of electrodes 36 and 37. In the preferred embodiment, combs 34 and 36 are connected to circuit ground, while output signals are taken from combs 35 and 37. The numbers of fingers, width of fingers, and spacing between adjacent fingers of transducer 32 are selected to provide a frequency response maximum at a frequency $f_1$ greater than $f_0$, the design center frequency, as is illustrated in FIG. 3A. Similarly, output transducer 33 has a frequency response maximum at frequency $f_2$ which is less than $f_0$ as is illustrated in FIG. 3B.

Comb 35 of transducer 32 and comb 37 of transducer 33 are connected to a detecting means which preferably includes a first detector 40 and a second detector 41. Detector 40 includes a diode 42 which has a cathode connected to comb 35. A filter comprising a parallel connected capacitor 43 and resistor 44 is connected between the anode of diode 42 and circuit ground. Detector 41 includes a diode 45 with its anode connected to comb 37. A filter comprising a parallel connected capacitor 46 and resistor 47 is connected between the cathode of diode 45 and circuit ground. The combined output signals from detectors 40 and 41 are coupled via resistors 50 and 51, respectively, to an input of an amplifier 52. The signal at the input of amplifier 52 is representative of the frequency deviation of the signal applied to input transducer 25 from the predetermined center frequency $f_0$. Accordingly, in AFC system 21 amplifier 52 is the error amplifier and provides an output signal to output 22.

FIG. 3C illustrates a typical frequency discriminator response characteristic. The frequency response of the frequency discriminator of FIG. 2 closely approximates the s-shaped curve of FIG. 3C, however, the side lobes of the $(\sin X/X)^2$ frequency response and the various parasitic effects noted above give rise to spurious responses outside the range $f_1$–$f_2$. These spurious responses can be of sufficient amplitude and of the proper phase to cause deleterious or erroneous operation of a system including the frequency discriminator. For example, in AFC system 21 such spurious responses may be generated during tuning and may cause false lock-in at a frequency other than the desired IF video carrier frequency.

In FIG. 2 a limiting means is provided to maintain the detecting means in an inoperative condition in response to signals from output transducers 32 and 33 which have amplitudes less than a threshold level. In FIG. 2 the limitng means includes a first limiter comprising resistors 53 and 54 connected in series between a source of positive voltage illustrated as a terminal 55 and circuit ground. The junction of resistors 53 and 54 is connected to comb 35 and the cathode of diode 42. A second limiter comprises resistors 56 and 57 connected in series between a source of negative voltage illustrated as a terminal 60 and circuit ground. The junction of resistors 56 and 57 is connected to comb 37 and the anode of diode 45. Resistors 53 and 54 establish a reverse bias potential across diode 42 so that the output signal from transducer 32 must exceed a predetermined threshold before diode 42 conducts. Similarly, a reverse bias is established across diode 45 by resistors 56 and 57 so that output signals from transducer 33 less than a predetermined threshold are suppressed. Accordingly, spurious output signals from output transducers 32 and 33 are suppressed due to the thresholds established by the limiting means.

Figure 4:
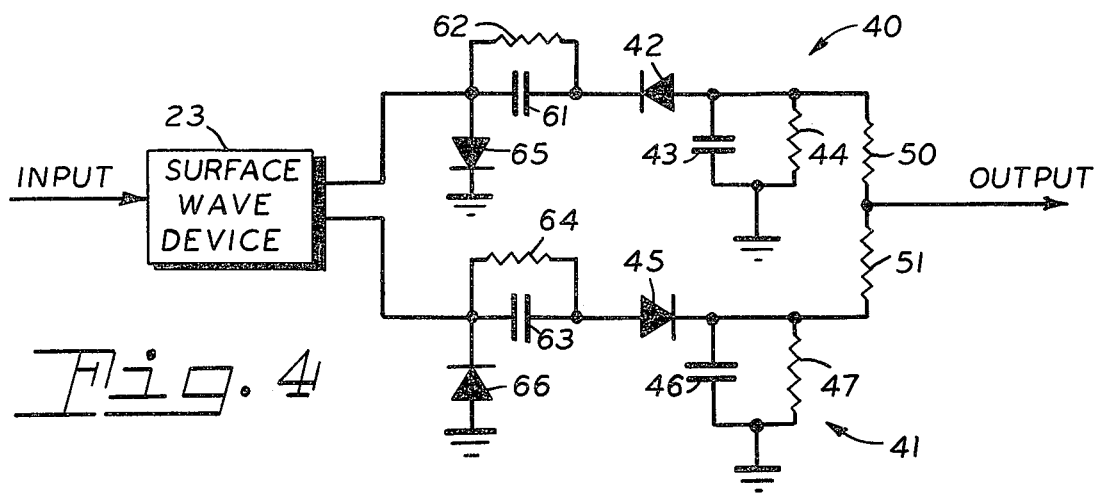

In FIG. 4 an alternate embodiment of the limiting means is illustrated. Surface wave device 23 and detectors 40 and 41 can be the same as in FIG. 2 and the various components therein are numbered the same. The limiting means includes a first limiter comprising a capacitor 61 and a resistor 62 connected in parallel between an output of surface wave device 23 and the cathode of diode 42 and a second limiter comprising a capacitor 63 and a resistor 64 connected in parallel between a second output of surface wave device 23 and the anode of diode 45. In FIG. 4 the limiters are self biasing. That is, current drawn through diode 42 flows through capacitor 61 to develop a bias thereacross while current drawn through diode 45 flows through capacitor 63 to develop a bias thereacross. The biases developed across capacitors 61 and 63 establish threshold levels for the output signals from surface wave device 23. Diodes 65 and 66 are connected between the respective outputs of surface wave device 23 and circuit ground to provide ground return paths for the currents that charge capacitors 61 and 63.

In FIG. 5 another embodiment of a limiting means in accordance with the invention is illustrated. The limiting means in FIG. 5 includes a first zener diode 67 connected between one output of surface wave device 23 and the cathode of diode 42 and a second zener diode 70 connected between the other output of surface wave device 23 and the anode of diode 45. Resistors 68 and 69 are connected between respective outputs of surface wave device 23 and circuit ground to provide a ground return for the output transducers. The junction between zener diode 67 and diode 42 is connected by a resistor 71 to circuit ground. The junction between zener diode 70 and diode 45 is connected by a resistor 72 to circuit ground. Zener diodes 67 and 70 suppress spurious output signals from surface wave device 23 which are less than their threshold or breakdown voltage.

Figure 6:
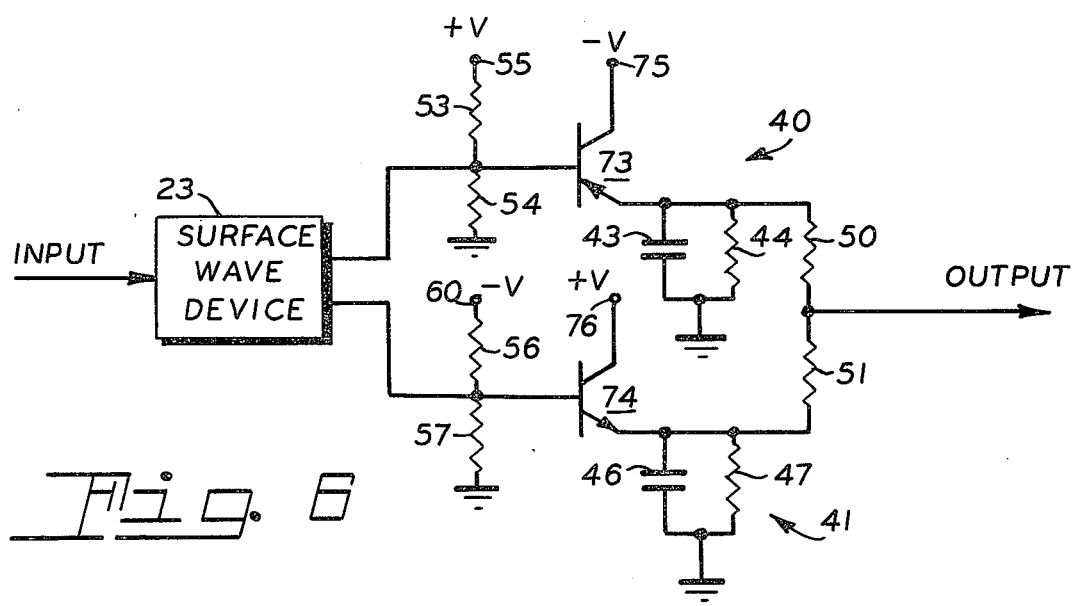

In FIG. 6 the detecting means and limiting means are similar to those illustrated in FIG. 2 except that transistors 73 and 74 replace diodes 42 and 45 in detectors 40 and 41, respectively. Transistor 73 has a base connected to the junction of resistors 53 and 54 and to an output of surface wave device 23. A collector of transistor 73 is connected to a source of negative voltage illustrated as a terminal 75 and an emitter is connected across the filter comprising capacitor 43 and resistor 44 to bias transistor 73 as an emitter-follower amplifier. Transistor 74 has a base connected to the junction of resistors 56 and 57 and to an output of surface wave device 23. A collector of transistor 74 is connected to a source of positive voltage illustrated as a terminal 76 and an emitter connected across the filter comprising capacitor 46 and resistor 47 to bias transistor 74 as an emitter-follower amplifier. Resistors 53 and 54 comprise a bias circuit to establish a positive bias voltage at the base of PNP transistor 73 which requires an output signal sufficient to overcome this positive threshold bias to become conductive. Similarly, the bias circuit comprising resistors 56 and 57 establish a negative threshold bias at the base of NPN transistor 74.

Figure 7:
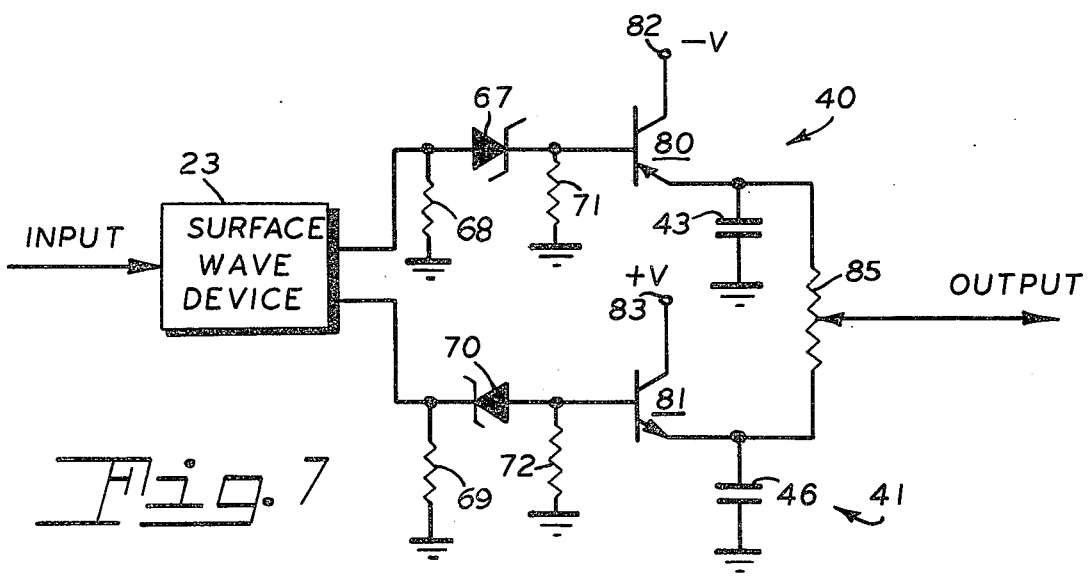

The embodiment illustrated in FIG. 7 is similar to the embodiment illustrated in FIG. 5 with transistors 80 and 81 replacing diodes 42 and 45 in detectors 40 and 41, respectively. A base of PNP transistor 80 is connected to the cathode of zener diode 67. A collector of transistor 80 is connected to a source of negative voltage illustrated as a terminal 82 and an emitter is connected across capacitor 43. A base of NPN transistor 81 is connected to an anode of zener diode 70. A collector of transistor 81 is connected to a source of positive voltage illustrated as a terminal 83 and an emitter is connected across capacitor 46. Resistors 50 and 51 are replaced by potentiometer 85 connected between the emitters of transistors 80 and 81 with the output signal being provided at the tap of potentiometer 85.

Accordingly, various embodiments of frequency discriminators in accordance with the invention have been illustrated and described. Frequency discriminators in accordance with the invention possess numerous advantages over the prior art such as the elimination of spurious responses by surface wave devices which deleteriously affect the operation of the frequency discriminator.

While there have been shown and described what are at present considered the preferred embodiments of the invention, it will be obvious to those skilled in the art that various changes and modifications may be made therein without departing from the scope of the invention as defined by the appended claims.

What is claimed is:

1. A frequency discriminator including a piezoelectric substrate having an input transducer and first and second output transducers disposed thereon, and detecting means connected to said output transducers, the improvement comprising limiting means connected to said detecting means for maintaining said detecting means in an inoperative condition in response to spurious signals from said output transducers having signal magnitudes less than a threshold level.

2. A frequency discriminator as defined in claim 1 wherein said detecting means includes first and second detectors connected to said first and second output transducers, respectively, and said limiting means includes first and second limiters connected to said first and second detectors, respectively.

3. A frequency discriminator as defined in claim 2 wherein said first and second detectors each include a diode and said first and second limiters provide reverse biases for the respective diodes.

4. A frequency discriminator as defined in claim 2 wherein said first and second limiters are zener diodes.

5. A frequency discriminator as defined in claim 2 wherein said first and second detectors each include a transistor and said first and second limiters bias the respective transistors.

6. A frequency discriminator as defined in claim 2 wherein said first and second detectors include first and second transistors, respectively, and said first and second limiters are zener diodes connected between said first and second output transducers and said first and second transistors, respectively.

7. A frequency discriminator comprising:
a surface wave device having a piezoelectric substrate, an input transducer disposed on said substrate and having frequency response maximum at a given frequency, a first output transducer disposed on said substrate and having a frequency response maximum at a first frequency greater than said given frequency, and a second output transducer disposed on said substrate and having a frequency response maximum at a second frequency less than said given frequency;
first and second detectors connected to said first and second output transducers, respectively;
means interconnecting said first and second detectors for developing a signal representative of the frequency deviation of a signal applied to said input transducer from said given frequency; and
limiting means connected to said first and second detectors for maintaining said first and second detectors in an inoperative condition to suppress spurious signals from said first and second output transducers having signal magnitudes less than respective negative and positive threshold levels.

8. A frequency discrimnator as defined in claim 7 wherein said first and second detectors include first and second diodes, respectively.

9. A frequency discriminator as defined in claim 8 wherein said limiting means includes first and second bias circuits connected between said first and second output transducers and said first and second diodes, respectively.

10. A frequency discriminator as defined in claim 8 wherein said limiting means includes first and second zener diodes connected between said first and second output transducers and said first and second diodes, respectively.

11. A frequency discriminator as defined in claim 7 wherein said first and second detectors include first and second transistors, respectively, each biased as an emitter-follower amplifier.

12. A frequency discriminator as defined in claim 11 wherein said limiting means includes first and second bias circuits connected between said first and second output transducers and said first and second transistors, respectively.

13. A frequency discriminator as defined in claim 11 wherein said limiting means includes first and second zener diodes connected between said first and second output transducers and said first and second transistors, respectively.

* * * * *